United States Patent
Leurs et al.

(10) Patent No.: US 7,563,990 B2
(45) Date of Patent: Jul. 21, 2009

(54) ELECTRONIC PRODUCT, A BODY AND A METHOD OF MANUFACTURING

(75) Inventors: Philip Rene Leurs, Heerlen (NL); Johannus Wilhelmus Weekamp, Eindhoven (NL); Fransiscus Gerardus Coenradus Verweg, Heerlen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 421 days.

(21) Appl. No.: 10/523,533

(22) PCT Filed: Aug. 5, 2003

(86) PCT No.: PCT/IB03/03157

§ 371 (c)(1),
(2), (4) Date: Feb. 2, 2005

(87) PCT Pub. No.: WO2004/016055

PCT Pub. Date: Feb. 19, 2004

(65) Prior Publication Data

US 2006/0097376 A1    May 11, 2006

(30) Foreign Application Priority Data

Aug. 5, 2002  (EP)  .................... 02078210

(51) Int. Cl.
*H01L 23/28* (2006.01)
(52) U.S. Cl. .................. 174/521; 174/260; 455/575.1
(58) Field of Classification Search ............. 174/521, 174/525, 527, 260; 455/575.1
See application file for complete search history.

(56) References Cited

U.S. PATENT DOCUMENTS

| | | | | |
|---|---|---|---|---|
| 4,410,759 | A * | 10/1983 | Kessler | 174/525 |
| 5,219,640 | A * | 6/1993 | Gazit et al. | 428/209 |
| 6,320,128 | B1 * | 11/2001 | Glovatsky et al. | 174/548 |
| 2002/0029900 | A1 * | 3/2002 | Wimberger Friedl et al. | 174/258 |
| 2002/0157247 | A1 * | 10/2002 | Li | 29/840 |
| 2003/0195020 | A1 * | 10/2003 | Kubo | 455/575.1 |

* cited by examiner

Primary Examiner—Hung V Ngo

(57) ABSTRACT

The electronic product comprises a body with a three-dimensional shape that is derived from the product. The body is provided with a pattern of conductors including contact pads and at least one electric element, in which the conductors are mechanically anchored in the body. It is preferably provided with attachment means for any carrier or external component. The pattern of conductors is primarily provided at the surface of the body. Conductors can be hidden inside the body, by removing in that area a releasable layer attached to the conductors before instead of after the molding process.

17 Claims, 4 Drawing Sheets

ELECTRONIC PRODUCT, A BODY AND A METHOD OF MANUFACTURING

The invention relates to an electronic product comprising a body provided with a three dimensional shape that is derived from the product and incorporates structurally at least part of the product shape. The invention also relates to a body suitable for use as a product part in a desired product and provided with a three dimensional shape that is derived from the product and incorporates structurally at least part of the product shape. The invention further relates to a method of manufacturing a body suitable for use as a product part in a desired product and provided with a threedimensional shape that is derived from the product and incorporates structurally at least part of the product shape, comprising the steps of:

- providing a foil having a releasable layer and a pattern of conductor tracks;
- attaching electrical elements to the conductor tracks;
- providing the body of electrically insulating material by a molding technique, therewith encapsulating the electrical elements and mechanically anchoring the conductor tracks in the body; and
- removing the releasable layer.

Contemporary products increasingly contain electronic components. Vehicles are full of electronic components that fulfill sensor functions and allow the operation of task with only a push on a button. Clothes and other articles are provided with electronics that can be read out wirelessly. Consumer electronics products ranging from shavers and coffeemachines to television sets, remote controls and mobile phones are bodies that include more functionality than in the past and also need to have a beautiful shape.

In order to fulfill the desire of the provision of electronics anywhere, the electronics can be attached to plastic parts, including housings that provide the shape of the desired products and appliances. There are various ways of attachment.

One of them is the use of a printed circuit board, to which the electronic components are attached and electrically contacted. The printed circuit board is provided inside a housing, such that it is not visible from the outside, or visible only to the extent that is desired. The disadvantage of the printed circuit board is however, that it takes considerable space and that it is in need of substantial assembly. The need for assembly can even limit the freedom of choosing the shape of the product.

Another way of attachment is the provision of the electronics on a label at a surface by means of adhesive. This is particularly an option wherein the label includes a transponder or wherein the body is a product part that will be surrounded by a housing. The use of adhesive however has the disadvantage that it is not always very robust. Moreover, electrical contacting of the components is not made easy, since it must be done either contactlessly or with a limited number of contacts.

In short, there is a need for such macroscopic bodies as housings and products parts in or to which any desired electronic components can be provided in a mechanically stable manner without limiting the freedom of design of the product shape.

It is therefore a first object of the invention to provide an electronic product of the kind mentioned in the opening paragraph, in which electronics are integrated without limiting the freedom of the designer and without making the body or the product mechanically or chemically vulnerable.

This object is achieved in that the body comprises an electrically insulating material and comprises a pattern of electrical conductors, which pattern includes contact pads for external contacting, that are exposed at a surface, which conductors are mechanically anchored in the body, a plurality of electric elements being encapsulated in the body and being electrically connected to the pattern of electrical conductors.

According to the invention, the electric elements and the pattern of conductors are embedded in the body. The body therewith does not only provide a structural shape of the product and/or to provide an esthetically desired appearance and/or a mechanical support for the product. The body is in fact also the encapsulation for the electric elements and functions as the circuit board for the attachment of electric contacts for external contacting.

It is an advantage of the body of the invention that its manufacture can be very straightforward and is hardly in need of assembly. Generally, the process flow of the manufacture includes a first step in which a foil is provided with a releasable layer and thereon the pattern of conductors. In a second step this foil is provided at a desired location in a mould and is overmoulded by the electrically insulating material in the desired shape. In a third step the releasable layer is removed from the body of electrically insulating material. The mechanical anchoring of the conductors is for instance achieved in that the releasable layer is slightly etched before provision of the molding material, such as to create underetch. A suitable combination of materials is the use of copper for the pattern of conductors and the use of Al for the releasable layer. This has the advantage that both the patterning of the copper conductors and the removal of the releasable layer can be realized with wet-chemical etching without deteriorating the other layers.

In principle, the complete pattern of conductors will be present at the surface of the body. Some additional steps may be taken however, that lead to the encapsulation of the conductors inside the body. First of all, a foil or spring assembly or alternative electrical connectors may be connected to the contact pads before the molding and be partly overmoulded together with the formation of the body. This provides a very robust integration of such a connector in the body. An alternative connector is for instance a connector to which a battery can be connected. Secondly, the pattern of conductors may be overmoulded in a separate step after the provision of the body. Thirdly, and particularly in combination with the use of the underetch for the anchoring, the pattern may include conductors with a relatively small and with a relatively large width. By a suitable choice of the underetch time, the small conductors can be included completely in the body, whereas the large ones will at least partially be present at the surface of the body. In a fourth elaboration, the releasable foil is substantially removed in a first area before the molding process, without removing the pattern of conductors in that area. The conductors in the first area can thereafter be provided with an encapsulation from all sides.

The electrically insulating material is preferably a polymer material, that is suitable for use in combination with molding techniques, particularly insert molding and has a good chemical and mechanical stability. Examples include polystyrene, polypropene, polyvinylchloride, polyphenylene sulfide.

It is particularly preferred that an additional coating is provided at the foil so as to improve the adhesion between any metal and the insert moulded polymer. A first example is the use of a material that melts on heating. Elements to be attached with solder balls to the pattern of conductors can first be provided on this material, that is heated thereafter. This process is further described in the non-prepublished application WO-IB03/02292 (PHNL020471). A second example is the provision of a coating after that the elements have been assembled on the pattern of conductors. The coating can then be provided not only at the interface of the conductors and the insert moulded material, but also at the interface of the elements and the insert moulded material. A suitable class of materials to be used for the coatings are copolymers. Particularly suitable appear to be vinyl copolymers of acrylic acid and alkyl acrylates.

It is furthermore preferred for good encapsulating properties of the molding material that it comprises fillers for absorption of moisture. Particularly suitable for this aim are silica or other metal oxides such as aluminum oxide and magnesium oxide. These fillers may be porous matrices.

The use of a foil of a releasable layer and a pattern of conductors thereon is per se known from EP-A 1,187,205. However, said application discloses the use thereof for chip scale packaging of integrated circuits. These are electronic components with typical dimensions in the order of 3*3 mm$^2$ or less, and the shape of the body herein follows the shape of the encapsulated electronic component. The insulating material is therein provided with transfer molding. In the present invention, however, the shape of the body is not based on that of the embedded components, but on that of the product of which the body is a part. In general, the dimensions of the body will thus be larger than that of an integrated circuit, and it will not have the shape of a rectangular block, such as an integrated circuit. Suitable dimensions are for instance at least 0.5 to 0.5 cm$^2$, and often more than 3 to 3 cm$^2$, and in one or more directions even 10 cm or even 1 m. To be sure, it is not necessary that the foil will have dimensions comparable to those of the body.

The use of such a foil is further known from GB-A 2,229, 864 as well as from U.S. Pat. No. 5,738,797. However, the known methods relate to the manufacture of a circuit board. It is not disclosed therein, that the circuit board can be used as encapsulation for electric components. It is not disclosed either, that the circuit board has a sufficient mechanical stability to act as the structural element in a product.

In a preferred embodiment, means are present for mechanical attachment of a device, component or carrier to the body. As the skilled person will understand, there is a variety of means that can be provided as part of the mould. This includes cavities and throughholes in the first place. It also includes any clamping means, threads for engagement with a thread of an external component and any edges, protrusions and corners as desired. The advantage hereof is that the electronic product can be a truly integrated system, wherein some elements are present at the surface of the body and others are integrated into the body. An example hereof is for instance a display, wherein the display is present at the surface, but wherein the display driver is hidden inside the body. Another example is for instance a radio: the loudspeaker is present at the surface, and the electronics are hidden inside the body. Such electronics do not only include passive components such as resistors, capacitors and inductors and protective components such as diodes, but also signal processing units. However, such signal processing unit could be integrated also with one of the elements at the surface, as is the case with an image sensor. Furthermore, with a small radio, it is an advantage that any electronics or user functionality needed in addition, such as a display or buttons can be part of the same product. Either they are integrated in the body, or they are present at the surface that has a shape fitted for mechanical attachment. It is even possible that such electronics or functionality is partly overmoulded and thus anchored in the body.

Particularly in this embodiment, the body acts as system integrator of various elements and components. It provides mechanical stability and shape. This is done not only in that the product has at least partly the shape of the body, but also in that any components attached to the body are given their position. Moreover, due to the versatile possibilities of the molding process, not only the position, but also the angle with respect to the surface of the body can be determined. This is particularly relevant for the optimal operation of microphones, cameras, displays and the like.

In a further embodiment, the electronic device comprises a sensing or transmitting first element provided at the surface of the body for radiation of a first kind and an auxiliary second element for processing or providing of the radiation, the first and second element having a predetermined spatial interrelationship to each other to allow their functioning, which is defined in the body, the first element being electrically connected to the pattern of electrical conductors in the body. The number of electronic devices being constructed from a first and a second element that need to be in a mutual interrelationship is large. A good example is a camera with a lens and a image sensor. In this case the body acts also defines the locations of the individual elements and therewith achieves the system integration, that previously needed to be dealt with separately.

A variety of electronic products is enabled with the invention. Electronic components could be introduced in the arms of a chair. Also, the electronics needed for switching and for power conversion in a coffee machines or a water boiler could be integrated in that part constituting a leg of the machine. In the example of a mobile phone or a remote control, the body may be a product part with a display and to which any buttons and any further RF electronics are attached afterwards. The product part can finally be provided with a separate housing. In the example of a dashboard the body of the dashboard will be the main structural part, as it currently is. The body is of course not only suitable for a dashboard at the front side of a vehicle, but can also be used at the doors and back side.

The invention also relates to a body for use in the product. Circuit boards included in a plastic part of a certain shape are for instance known from GB-A 2,229,864. In this embodiment the pattern of conductors is bent so as to provide any required shape. However, the known circuit board does not include any electric elements, and it appears disadvantageous to do a bending operation either before or after the placement of elements on a foil. Nevertheless, a full flexibility of the required three-dimensional shape of the body is desired, such that the body can function as the system integrator giving mechanical support. It is therefore a second object of the invention to provide a body that fulfills these objects.

This second object is achieved in a body suitable for use as a product part in a desired product and provided with a threedimensional shape that is derived from the product and incorporates structurally at least part of the product shape, which body comprises an electrically insulating material and comprises a pattern of electrical conductors, which pattern includes contact pads for external contacting which conductors are mechanically anchored in the body, a plurality of electric elements being encapsulated in the body and being electrically connected to the pattern of electrical conductors, wherein the conductors are present at a surface only partially.

In the invention, the conductors are present at the surface of the body only at certain areas, whereas in other areas they are hidden inside the body. There are particularly two methods for achieving this functionality. First of all, the pattern of conductors may be overmoulded in a separate step after the provision of the body. This is a simple and straightforward implementation, however, with the limitation that the products need to be brought back into a mold after removal of the releasable layer, and with the limitation that the molding of the additional features may not affect the shape of the already moulded body negatively.

In a second, preferred method, the releasable foil is substantially removed in a first area before the molding process, without removing the pattern of conductors in that area. The conductors in the first area can thereafter be provided with an encapsulation from all sides.

Although not preferred in assembly, it nevertheless may be that the surface of the body includes a first and a second face which mutually includes an angle unequal to 180° C. and wherein the pattern of conductors extends along the first and the second face. This is particularly suitable if the pattern of conductors comprises a plurality of tracks are positioned in parallel and need to be fitted to the desired shape. It is furthermore suitable, if electric components need to be attached and contacted at different faces, particularly at opposed faces.

In another embodiment, the pattern of conductors includes contact pads for contacting a component that can be assembled to the surface of the body, and the shape of the body is fitted for assembly of the active device. For many applications, it is advantageous that any further active devices can be assembled to the surface of the body. Examples of such active devices are integrated circuits and other such semiconductor devices, which may be too expensive for integration in the body; display devices, speakers, microphones and lenses that need to be provided at the surface of the body in order to fulfill their functions; and other devices for which integration is not preferred.

In a further elaboration hereof, the surface of the body is provided with a cavity in which the active device fits. In this manner the active device is given a mechanical protection.

The invention further relates to a method of manufacturing a body suitable for use as a product part in a desired product and provided with a threedimensional shape that is derived from the product and incorporates structurally at least part of the product shape.

It is a third object of the invention to provide such a method with an improved freedom of design of the product shape. This object is achieved in that it comprises the steps of:
  providing a foil having a releasable layer and a pattern of conductor tracks, the pattern comprising an first area that is to be hidden in the body;
  removing the releasable layer from the first area to the extent that any conductor tracks;
  attaching electrical elements to the conductor tracks;
  providing the body of electrically insulating material by a molding technique, therewith encapsulating the electrical elements and mechanically anchoring the conductor tracks in the body; and
  removing the releasable layer to the extent that it is present at a surface of the body.

In this method, integration is achieved by suitably patterning the releasable layer before provision of the mould. This leads to an efficient method with a good result.

The removal of the releasable layer before the insertion into the mold is preferably done by cutting. This results therein that the releasable layer is also integrated in the body. That is not problematic if the releasable layer is not too thick. Furthermore, it has the advantage that the first area is provided with some mechanical stability after the cutting. Alternatively, other methods such as localized dry of wet etching or irradiation with ultraviolet light could be used. The type of removal is also dependent on the specific foil in use. The releasable layer can in principle be a layer of a metal, such as Al, Cu, or steel, organic material, and a ceramic material such as glass or silicium. The resolution of the patterning is preferably in the range of millimeters to centimeters. However, with an automation of the local patterning higher resolution can be achieved.

The method has its main benefit if also electric elements are integrated in the body, but is in principle also applicable for a body without any embedded electric elements.

Another aspect of the invention resides in an electrically insulating body that comprises a flexible portion. Such a flexible portion may be used for a specific connection to a component, so as to adapt the body to the desired shape or to act as a contacting portion. Such is flexible portion is achievable in that the insulating material is provided in more than one step, in each of which steps desired insulating materials are used, such that a first portion is provided with an elastic insulating material and a second portion is provided with a hard, non-elastic insulating material.

Examples of non-elastic materials are thermoharders, epoxides, standard injection molding materials such as polyphenylenesulfide, polystyrene, nylons, polyester PET, PBT and PCT, polyetherimide, polyethersulphone, polyarylsulphone, polysulphone, polyetherketone, polyetheretherketone. The materials may be strengthened with glass fibers or desired particles as known to the skilled person. Particularly they are provided with any cross-linking agent which rigidifies the a structure and is initiated by heating. Examples of elastic materials are thermoplastic materials without or substantially without any such cross-linking agent. Particularly suitable are polyimide and benzocyclobutene. Any other elastic and non-elastic materials will be apparent to the skilled person.

As compared to the body known from GB-A 2,229,864 it is a clear advantage that the resulting body is fitted for many more shapes. This is particularly suitable for integration of the body is a casing with limited space. It is also advantageous with bodies of larger dimensions, particularly if the body has a threedimensional shape derived from the product in which it is used. The edges of the body may be made flexible, therewith reducing any damage to the body when inserted in a casing. An intermediate portion between a first and a second rigid portion may be flexible, so as to allow bending of the rigid portion with respect to each other. Alternatively, a mainly flexible body may be provided with rigid portions, at which it can be mechanically and electrically contacted.

In a suitable embodiment, the flexible portion is provided with conductors according to a desired pattern. The flexible portion has the same function as a flexfoil, but need not to be assembled to it. Therewith, a problem of electrical contacting is reduced substantially.

The body according to this aspect of the invention, is preferably provided with conductors that are present at a surface of the body at least partially. As explained above, the conductors may be hidden in the inside of the body in various ways. It is furthermore preferred that the conductors are mechanically anchored, so as to provide a good adhesion between conductors and the body. It may well be that the pattern of conductors extends over a first and a second face of the body, or even extends to a third face opposed to the first face.

In many applications it will further be preferred that any electrical elements are embedded in the body. Examples of elements include diodes, resistors, capacitors, inductors, transformers, integrated circuits. Therewith the body, having a three dimensional shape and including the desired elements is really a system of its own, that does not need any wireless transmission of energy and data, but can make use of conventional galvanic coupling.

The electronic device can be used for many applications. Applications in the field of mobile communication, consumer electronics and automotive electronics are particularly preferred in view of the miniaturization and increase of functionality in those areas. Any components attachable to the body are particularly components that provide a user interface, and components that are too vulnerable or expensive or else to be integrated. The body can be provided with any cavities, holes and other mechanical attachment means for adequate location and attachment of these components. For their electric contacting, they will be connected to the pattern of conductors. Signal processing units may be hidden in the body. The body can also define the system if two or more components need a spatial interrelationship for their proper functioning, such as a lens and an image sensor in the example of a camera.

If the flexible portion is used for contacting, it can be very helpful a connector is present at one end of the flexible portion or at a rigid portion connected to that end. It is the advantage of the body of this invention that any suitable connector can be integrated in the body by overmolding.

With respect to the manufacturing of this body having a flexible portion, it is observed that the exact implementation of such process is open to engineering optimization by the skilled person. The expression 'first mold' and 'second mold' is understood in the context of this application to include both the implementation with separate moldings and the implementation with one mold having two or more chambers. For both processes it appears suitable to use an insertion molding process. As mentioned above, any additional coatings can be used to improve the adhesion between metal and the insertion moulded material. The releasable layer is chosen to desire. Good results have been obtained with a foil with copper patterns and a releasable layer of aluminum. Alternatively, the patterns can be of Al, and the releasable layer is of copper. Copper could be used as well for both the releasable layer and the pattern of conductors, with a suitable barrier in between of both. However, silicon and an organic, UV-releasable material could be used as releasable layers as well.

These and other aspects of the invention will be further explained with reference to the figures, in which identical components have been given the same reference numerals and in which.

Figure 1:
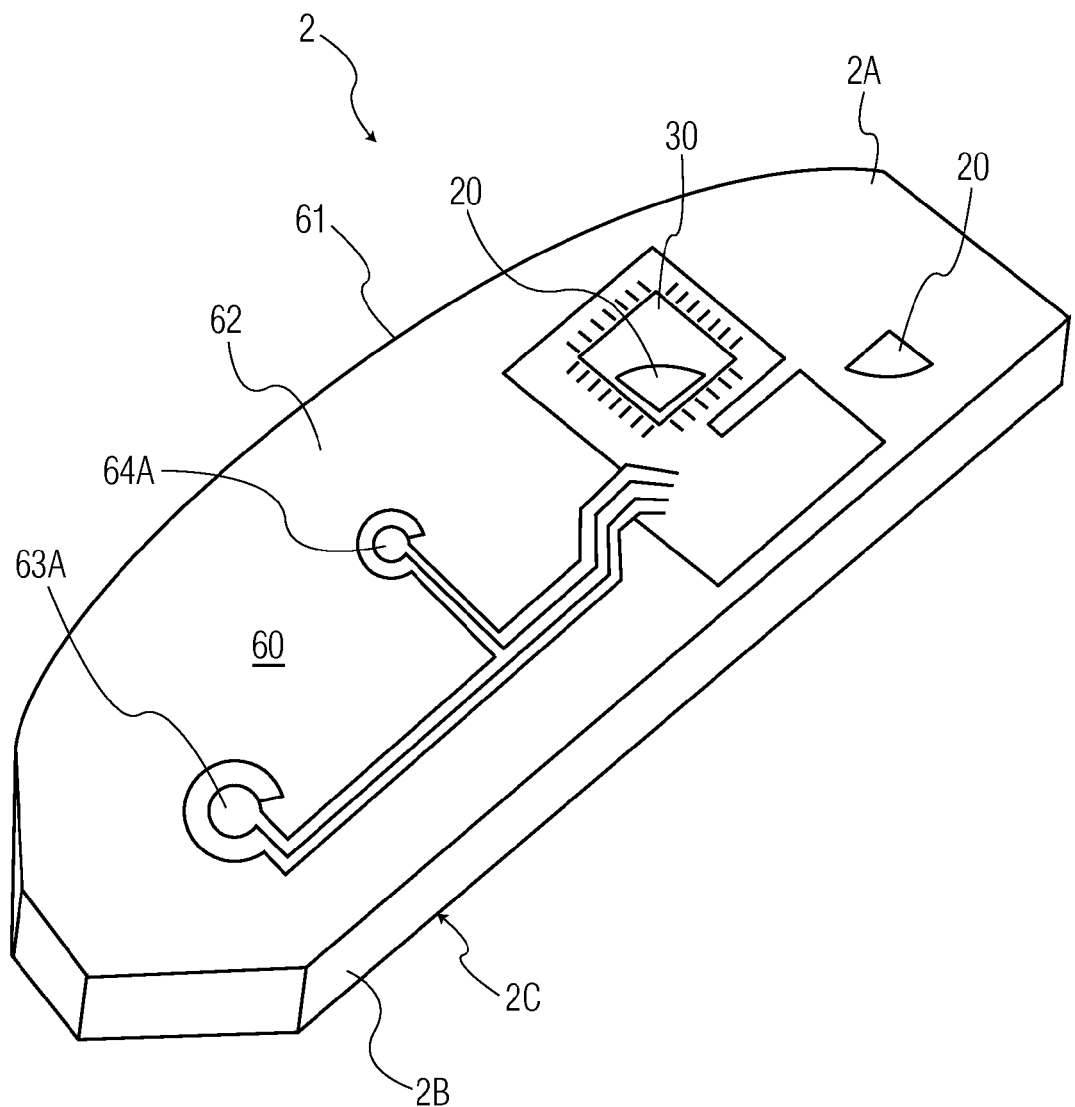
FIG. 1 shows a first embodiment of the body in a diagrammatic perspective view.
Figure 2:
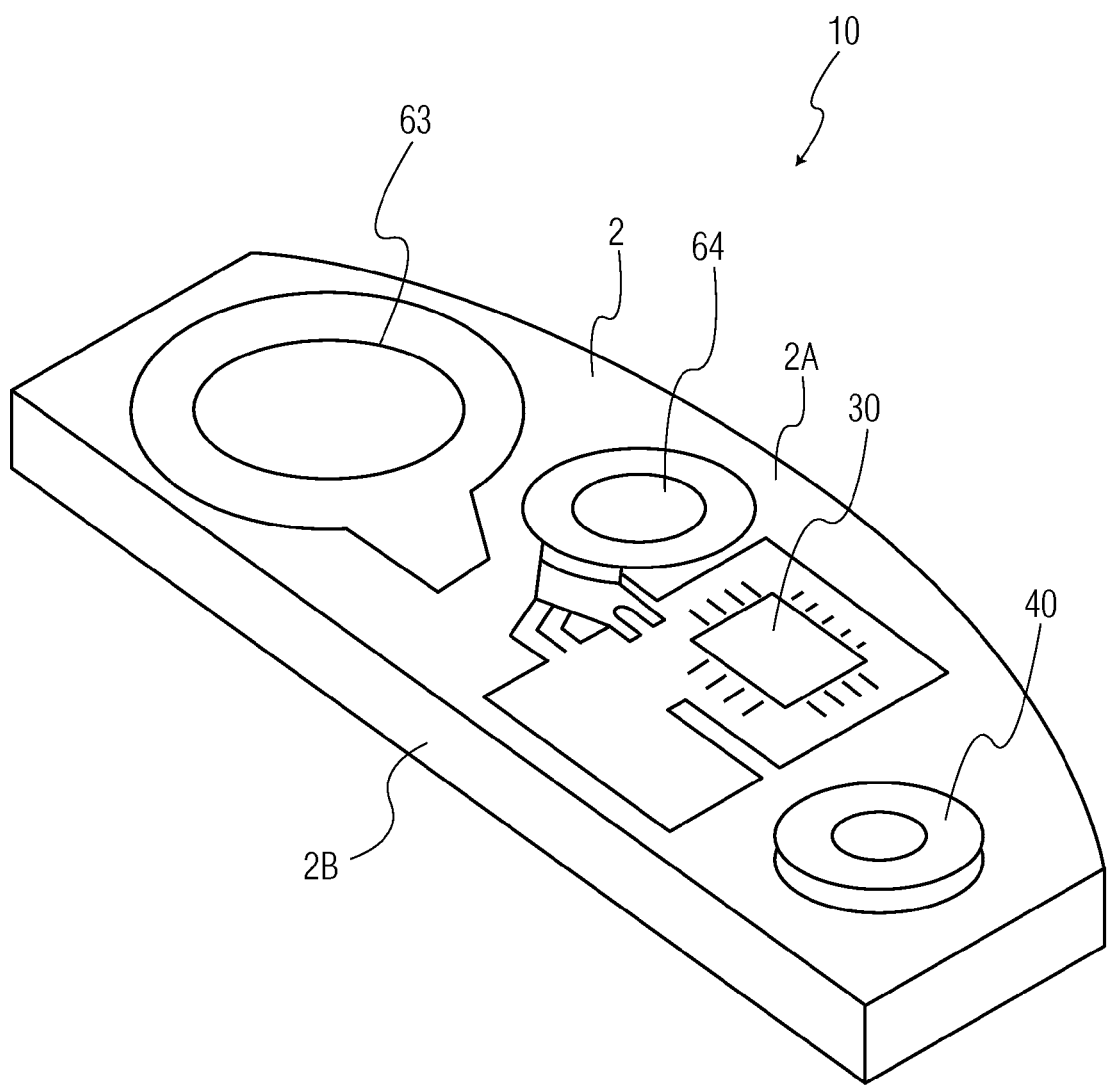
FIG. 2 shows a first embodiment of the device comprising the body shown in FIG. 1 in a diagrammatic perspective view.

FIG. 1 shows a first embodiment of the electrically insulating body 2 according to the invention. FIG. 2 shows the corresponding electronic device 10. The body is manufactured in the following manner. First a carrier plate is provided, which comprises a first releasable layer, herewith a thickness of 30 μm and made of Al, on which a second, electrically conductive layer is present. The second layer is in this case made of copper and has a thickness of 10 μm. This second layer is patterned into conductors through a mask of silicon oxide by etching with an aqueous solution of ferrichloride. This solution leads also to some etching of the Al, leading to underetch under the conductors.

Hereafter, in this embodiment, the carrier plate is bent in the desired shape and provided in the mold. Electric elements, such as resistors, capacitors and diodes, and optionally also integrated circuits can now be provided on the conductors. Solder is used to provide an electrical connection between the conductors and the electric elements, but anisotropically conducting adhesive can be used alternatively. Then, any suitable synthetic resin, for instance PPS (=PolyPhenylene Sulphide) is injected in the mold and the body 2 is formed by injection molding. Finally, the releasable layer of the carrier plate is removed.

The body 2 of this example is made to be suitable for a variety of active devices that are to be assembled at the surface of the body. This procedure yields not only openings 20, but also a cavity 60 with a side 61 and a bottom 62, the conductor pattern extending up to the bottom 62. The cavity 60 is suitable for accommodating elements such as a loudspeaker 63 and a buzzer 64, as shown in FIG. 2. The openings 20 are suitable for the formation of cameras, that are constructed through the assembly of a lens 40 and a photosensitive semiconductor element 30. The two cameras are positioned in opposite directions, for which reason the conductor pattern extends from the first side 2A via the second side 2B to the third side 2C.

The shape of the body 2 is not derived from the size of the components, but from the product in which it has to be used. This body is made to fit in the upper part of a mobile phone, in the area above the display. Although not shown in this embodiment, it can be provided with clamping means to be attached more easily to the housing of the mobile phone.

Figure 3:
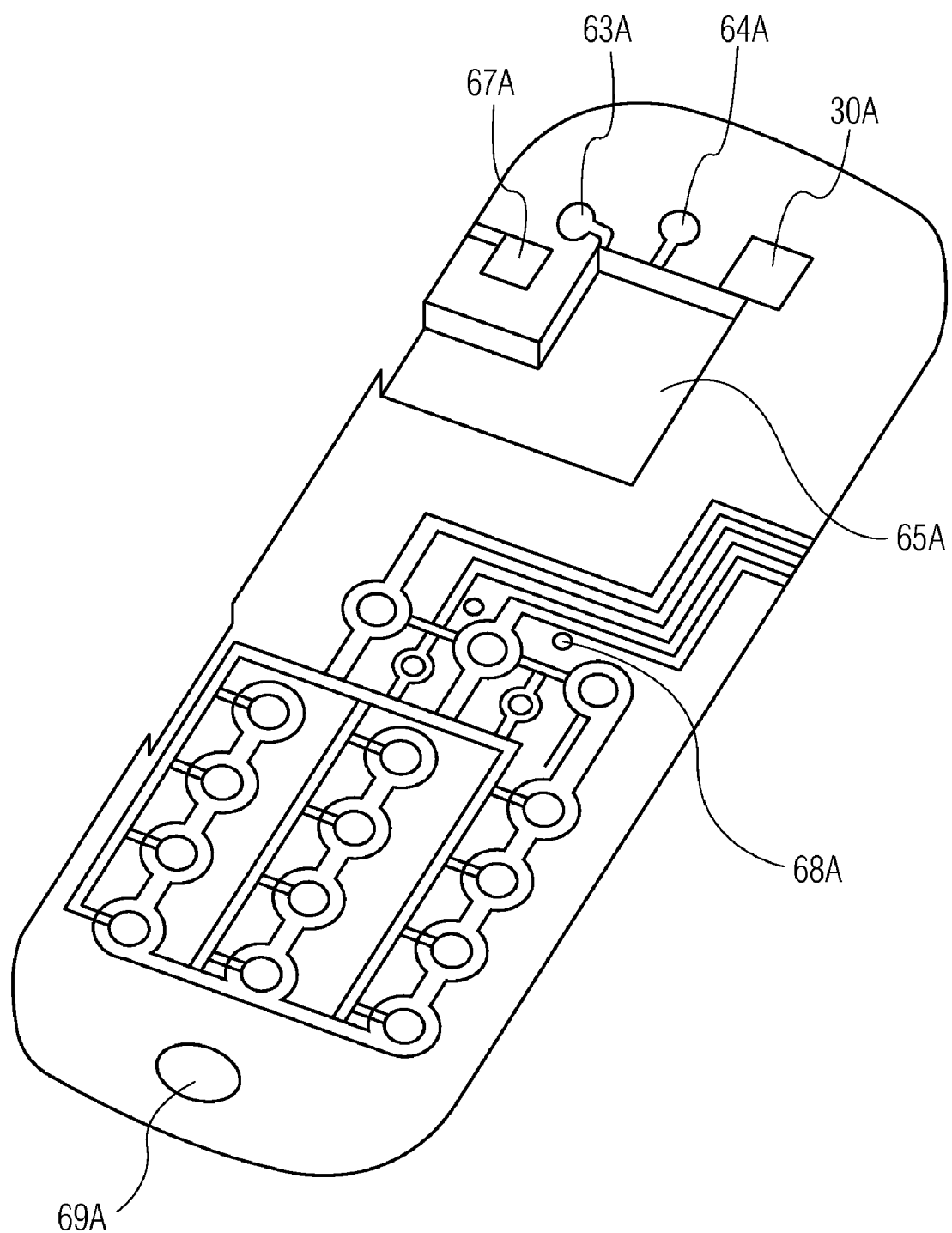
FIG. 3 shows a first embodiment of the body in a diagrammatic perspective view.
Figure 4:
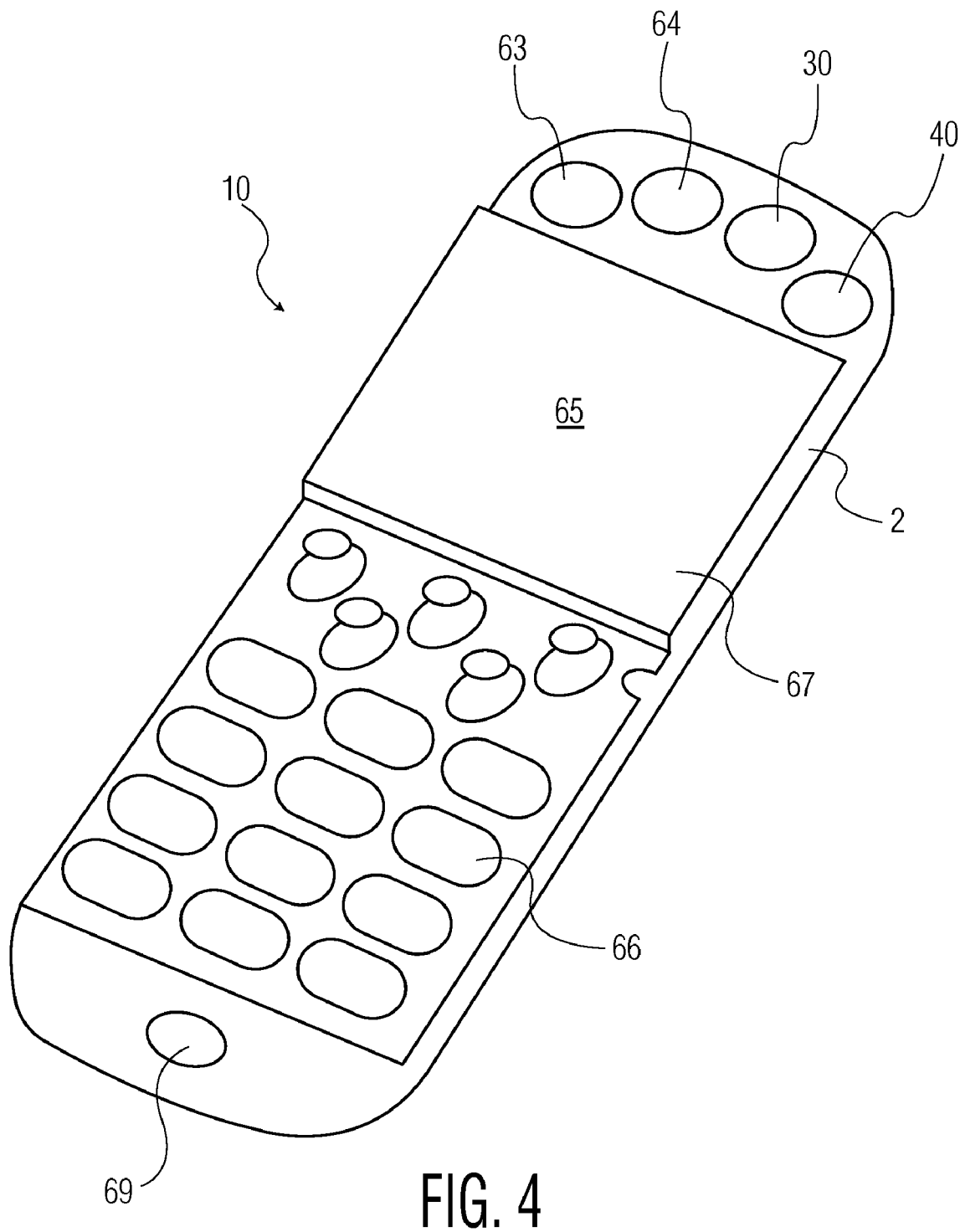
FIG. 4 shows a first embodiment of the device comprising the body shown in FIG. 3 in a diagrammatic perspective view.

FIG. 3 shows a second embodiment of the body 2 of the invention. FIG. 4 shows the corresponding device 10. The body in this example is the carrier for a large number of desired electronic elements of a mobile phone. These are in particular the elements which provide the interface to the user. The shape of the body 2 is chosen such that it forms the basic carrier plate of any components in the mobile phone. To this body 2 not only the desired electronic elements can be attached, but also any RF part of the mobile phone can be attached.

At the rear side 2C (not shown) of the body 2, conductors 1 provide interconnections between the elements, and connection regions are present for the placement of elements which implement the required control functions. It is also possible for a contacting region for a flexible foil or a connector to be defined at that side. Connections are present for a semiconductor element 30 of a camera, a loudspeaker 63, a buzzer 64, a display 65, keys 66, a touchscreen 67, lamps 68 (preferably light-emitting diodes) and a microphone 69. The areas for these elements are indicated in FIG. 9 by their reference numerals followed by A (for example 30A). It is noted that the body has the advantage that a direct connection between (the semiconductor elements 30 of) the cameras and the picture screen 65 and the keys 66 and/or the touchscreen 67 is also possible without connections having to be realized by means of connectors or flexible foils. The number of connections may thus be advantageously reduced, and the camera 41 and the picture screen 65 can be mutually attuned in the assembly.

It is further noted that the conductors 1 in this embodiment lie in a recess at a side, whereby possible damage is prevented. Such damage, however, is improbable anyway when such a manufacturing method is used (with the underetched copper conductors) that leads to a recessed position of the conductor pattern.

The conductor pattern providing the drive of the touchscreen 67 comprises a flexible portion in this embodiment. This is formed in that a portion of the carrier plate is provided with an elastic synthetic resin such as polyimide instead of PPS. Connectors and flexible connections between two portions of the body 2 can also be integrated in this manner.

It is further noted that although not explicitly shown, the body is very suitable for integration of electric elements that are needed for a proper operation. Examples hereof are capacitors, resistors, transformers, diodes for ESD protection, transistors and other switches, and possibly also integrated circuits such as a display driver.

It is also noted that the threedimensional shape of the shown conductor pattern is not absolutely necessary. A simpler version which extends in only two dimensions can be made as well. Moreover, part of the conductors can be provided inside the body in a simple way, in that the carrier plate is substantially cut away at those areas in which the conductors need to be embedded in the body. The cutting is done such that the conductors are separated from each other. The resulting conductors will be embedded in the body including the releasable layer. The resulting body can thus have the shape to accommodate the active devices as good as possible and to be suitable for integration in and attachment to the housing of the apparatus, in this case a mobile phone.

The invention claimed is:

1. A consumer electronic product comprising a body provided with a three-dimensional shape that is derived from the consumer electronic product and incorporates structurally at least part of a shape of the consumer electronic product, wherein the body comprises an electrically insulating material and a pattern of electrical conductors, wherein the pattern includes contact pads for external contacting and the conductors are mechanically anchored in the body, a plurality of electric elements being encapsulated in the body and being electrically connected to the pattern of electrical conductors, wherein the body includes a front part, a rear part and a side part between the front part and the rear part, the body having a recess at the side part, and wherein a portion of the conductors lie in the recess.

2. The electronic product as claimed in claim 1, further comprising means for mechanical attachment of a component or carrier to the body.

3. The electronic product as claimed in claim 1, wherein the pattern of conductors includes contact pads for contacting a component that can be assembled to a surface of the body, and wherein the three-dimensional shape of the body is fitted for assembly of the component.

4. The electronic product as claimed in claim 1, further comprising a sensing or transmitting first element at a surface of the body for radiation of a first kind and an auxiliary second element for processing or providing of the radiation, the first element and the second element having a predetermined spatial interrelationship to each other to allow their functioning, which is defined in the body, the first element being electrically connected to the pattern of electrical conductors in the body.

5. The electronic product as claimed in claim 1, further comprising a separate signal processing unit in or at a surface of the body.

6. The consumer electronic product of claim 1, wherein the consumer electronic product comprises a mobile phone, and the three-dimensional shape of the body forms a basic carrier plate of components in the mobile phone.

7. The consumer electronic product of claim 1, wherein the front part comprises elements including at least one of a camera, a loudspeaker, a buzzer, a display, a key, touchscreen, a lamp and a microphone.

8. The consumer electronic product of claim 1, wherein the elements are directly connected to each other without connectors or flexible foils cables.

9. The consumer electronic product of claim 1, wherein the consumer electronic product comprises at least one of a mobile phone, a coffee machine, a water boiler, and remote controller.

10. A body suitable for use as a product part in a consumer electronic product and provided with a three-dimensional shape that is derived from the consumer electronic product and incorporates structurally at least part of the three-dimensional shape of the consumer electronic product, the body comprising an electrically insulating material and a pattern of electrical conductors, wherein the pattern includes contact pads for external contacting and wherein the conductors are mechanically anchored in the body, a plurality of electric elements being encapsulated in the body and being electrically connected to the pattern of electrical conductors, wherein the conductors are present at a surface only partially, wherein the body includes a front part, a rear part and a side part between the front part and the rear part, the body having a recess at the side part, and wherein a portion of the conductors lie in the recess.

11. The body as claimed in claim 10, wherein the contact pads for external contacting are exposed at the surface of the body.

12. The body as claimed in claim 10, further comprising means for mechanical attachment of a device, component or carrier to the body.

13. An electrically insulating body provided with a conductor pattern, wherein the body acts as a carrier of the conductor pattern and as a carrier of elements embedded in the body and/or components assembled to the body, and wherein the body includes a rigid portion and a flexible portion, in which rigid portion the body comprises a non-elastic electrically insulating material and in which flexible portion the body comprises an elastic, electrically insulating material, and wherein the body defines locations of the elements and has a shape of a consumer electronic product, wherein the body includes a front part, a rear part and a side part between the front part and the rear part, the body having a recess at the side part, and wherein a portion of the conductors lie in the recess.

14. An electrically insulating body as claimed in claim 13, wherein the flexible portion comprises conductors according to a desired pattern.

15. An electrically insulating body as claimed in claim 13, wherein the flexible portion is provided between a first and a second rigid portion.

16. An electrically insulating body as claimed in claim 13, wherein the pattern of conductors is at least partially present at a surface of the body.

17. An electronic device comprising the electrically insulating body as claimed in claim 13, and an electric element that is assembled to the body or embedded in the body.

* * * * *